United States Patent
Rabkin et al.

(10) Patent No.: US 7,160,774 B2
(45) Date of Patent: Jan. 9, 2007

(54) METHOD OF FORMING POLYSILICON LAYERS IN NON-VOLATILE MEMORY

(75) Inventors: Peter Rabkin, Cupertino, CA (US); Hsingya Arthur Wang, San Jose, CA (US); Kai-Cheng Chou, San Jose, CA (US)

(73) Assignee: Hynix Semiconductor, Inc., Kyoungki-Do (KR)

( * ) Notice: Subject to any disclaimer, the term of this patent is extended or adjusted under 35 U.S.C. 154(b) by 50 days.

(21) Appl. No.: 10/870,285

(22) Filed: Jun. 16, 2004

(65) Prior Publication Data
US 2004/0227179 A1 Nov. 18, 2004

Related U.S. Application Data

(62) Division of application No. 09/994,545, filed on Nov. 26, 2001, now Pat. No. 6,812,515.

(51) Int. Cl.
*H01L 21/336* (2006.01)
(52) U.S. Cl. .......... 438/257; 438/593; 257/315; 365/185.24; 365/185.26
(58) Field of Classification Search ........... 438/257
See application file for complete search history.

(56) References Cited
U.S. PATENT DOCUMENTS

| | | |
|---|---|---|
| 4,978,626 A | 12/1990 | Poon et al. |
| 4,992,391 A | 2/1991 | Wang |
| 5,840,607 A | 11/1998 | Yeh et al. |
| 6,107,169 A | 8/2000 | Park |
| 6,252,277 B1 | 6/2001 | Chan et al. |
| 6,512,273 B1 | 1/2003 | Krivokapic et al. |
| 6,611,032 B1 * | 8/2003 | Schuegraf et al. .......... 257/412 |

OTHER PUBLICATIONS

Merriam-Webster's Collegiate Dictionary, 10th Ed. Merriam-Webster, Inc.: Springfield, MA, 1998, p. 482.*

Ng, Kwok K., Complete Guide to Semiconductor Devices, 2nd Ed. John Wiley & Sons: New York, 2002, pp. 346-347.*

* cited by examiner

*Primary Examiner*—Carl Whitehead, Jr.
*Assistant Examiner*—Colleen E. Rodgers
(74) *Attorney, Agent, or Firm*—Townsend and Townsend and Crew LLP (57) ABSTRACT

In accordance with an embodiment of the present invention, a semiconductor structure includes an undoped polysilicon layer, a doped polysilicon layer in contact with the undoped polysilicon layer, and an insulating layer in contact with the undoped polysilicon layer. The undoped polysilicon layer is sandwiched between the doped polysilicon layer and the insulating layer.

11 Claims, 6 Drawing Sheets

METHOD OF FORMING POLYSILICON LAYERS IN NON-VOLATILE MEMORY

CROSS-REFERENCE TO RELATED APPLICATIONS

This application is a Division of U.S. application Ser. No. 09/994,545, filed on Nov. 26, 2001, now U.S. Pat No. 6,812,515 which disclosure is incorporated herein by reference.

BACKGROUND OF THE INVENTION

Figure 1A:
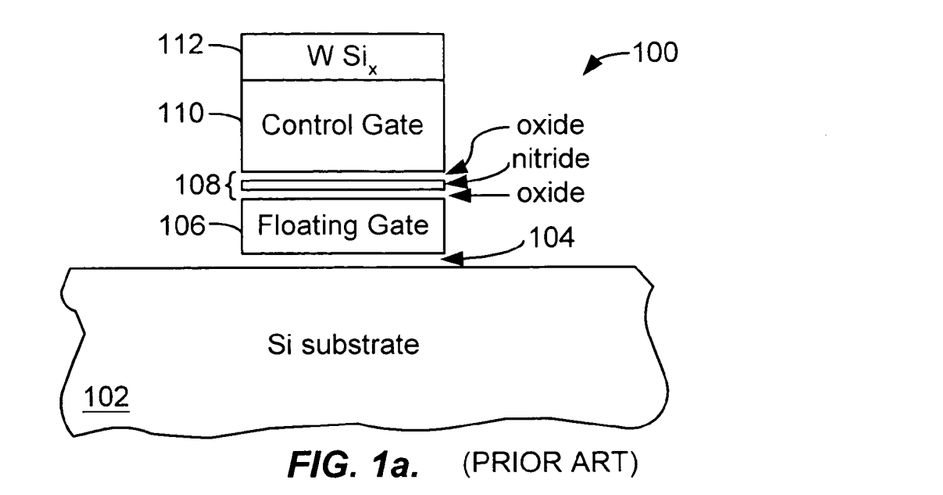
FIGS. 1a and 1b show cross section views of a conventional stacked-gate non-volatile memory cell at different processing stages.
Figure 1B:
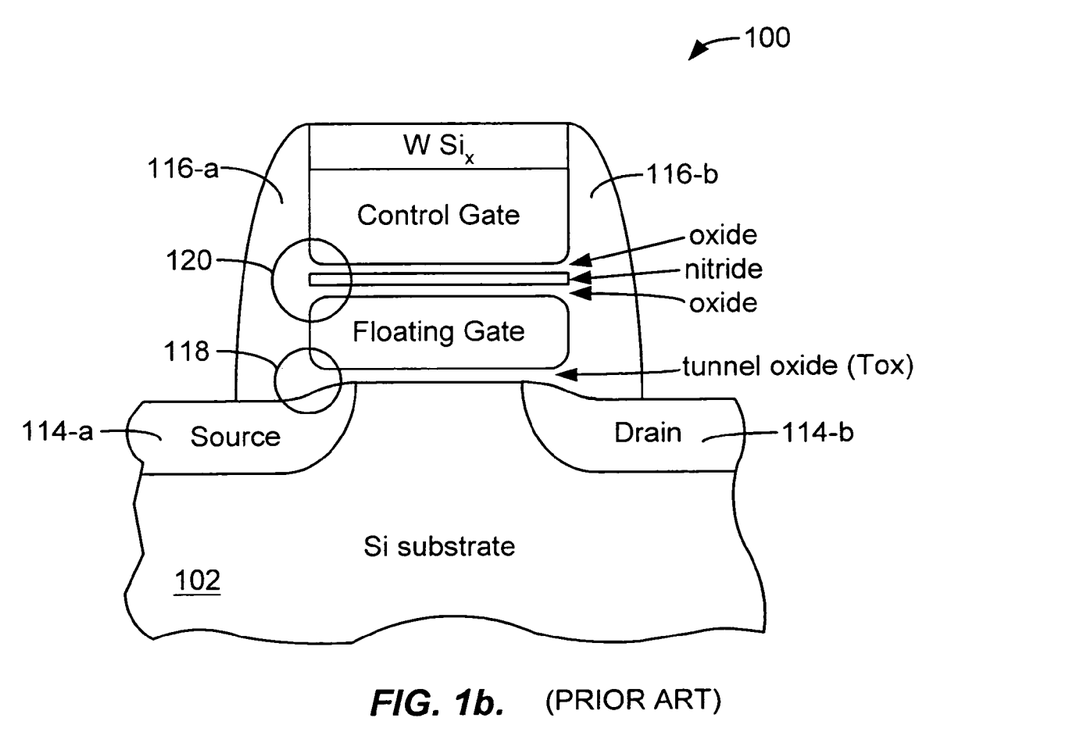

FIG. 1a shows a cross section view of a conventional stacked-gate non-volatile memory cell 100 at an intermediate processing stage. Cell 100 has a polysilicon (gate) stack which includes floating gate 106 and control gate 110 insulated from each other by a composite oxide-nitride-oxide (ONO) dielectric layer 108. A tungsten layer (WSi$_x$) 112 overlies control gate 110. Floating gate 106 is insulated from the underlying silicon substrate 102 by a tunnel oxide layer 104. FIG. 1b shows a cross section view of cell 100 after formation of: (a) oxide spacers 116-a, 116-b along sidewalls of the gate stack, and (b) source region 114-a and drain region 114-b in substrate 102.

A simplified conventional process sequence to form memory cell 100 includes: forming tunnel oxide layer over substrate 102; depositing a first layer polysilicon over the tunnel oxide layer; forming an interpoly composite ONO dielectric layer over the first layer polysilicon; depositing a second layer polysilicon over the ONO dielectric; forming a tungsten silicide layer over the second layer polysilicon; and self-aligned mask and self-aligned etch (SAE) to form the gate stack as shown in FIG. 1a. In modern technologies, the control gate is often formed simultaneously with the gates of peripheral (CMOS) transistors, followed by cell self-aligned etch (SAE) of the first layer polysilicon and the ONO dielectric using the control gate as a mask. After formation of the gate stack, in some processes, polysilicon re-oxidation is performed. DDD mask and implant steps are then carried out to form the cell source DDD region (if for example a source DDD region is employed) and DDD regions for peripheral high voltage (HV) NMOS and PMOS transistors. Next, cell source/drain mask and implant steps are carried out to form cell source and drain regions 114-a, 114-b, followed by oxidation and anneal cycles. LDD mask and implant steps may then be carried out to form LDD junctions for the low voltage (LV) NMOS and PMOS transistors. Spacers (e.g., spacers 16-a, 116-b in FIG. 1b) are then formed along sidewalls of the gate stack in the cell and along the side-walls of the gates of the periphery transistors. This is followed by N$^+$ and P$^+$ mask and implant steps to complete the junction formation of the peripheral transistors.

The first and second polysilicon layers are deposited by means of Chemical Vapor Deposition (CVD). Both first and second polysilicon layers are in-situ doped (usually by phosphorus P31) to a relatively high level (e.g., 2×10$^{19}$ to 5×10$^{20}$ cm$^{-3}$). The level of polysilicon doping is usually controlled by gas flow rate and pressure of the gas compound containing P31, such as PH3. An example of a set of parameters associated with the polysilicon deposition of a conventional process is provided below.

| Thickness Target; Å | Temperature; °C. | SiH4 flow rate; sccm | PH3 flow rate; sccm | Pressure; mTorr | Rs; Ω/□ |
|---|---|---|---|---|---|
| 600–1000 | 580–620 | 1200–1400 | 80–120 | 350–450 | 200–1000 |

There are a number of reasons for the high polysilicon doping. First, the high doping prevents or minimizes polysilicon depletion when gate bias is applied to the control gate of the memory cell or to the gate of the MOS transistor. Polysilicon depletion decreases gate capacitance thus reducing gate control in a MOS transistor channel region, and impairs other transistor/cell electrical characteristics. Second, the high doping helps maintain a proper value of polysilicon work function which impacts such important transistor/cell parameters as the threshold voltage. Third, the high doping reduces the world line resistance in the memory array, thus improving the memory performance. Fourth, the high doping reduces time delay associated with the peripheral transistor gate capacitance and resistance.

However, there are also drawbacks to the high polysilicon doping. The high doping leads to higher oxidation rate of polysilicon crystals. Higher oxidation rate in turn leads to a more pronounced "smiling" effect, i.e., an increased gate oxide thickness at the edges of the gate in MOS transistors, and similar increase of tunnel oxide thickness and ONO dielectric at the edges of the cell gate stack as shown in FIG. 1b by circles marked by reference numerals 118 and 120. Although some minimal "smiling" effect can serve a useful reliability purpose by rounding corners of polysilicon thus reducing the electric field peak at polysilicon edges, excessive "smiling" effect impairs gate control of the channel and the drive current of MOS transistors. In memory cells, a pronounced "smiling" effect of ONO dielectric impairs gate coupling ratio, gate channel control, and program, erase, and read efficiency.

A further drawback of the high doping is that it leads to a larger polysilicon grain size which in turn leads to a more rugged interface between the gate oxide and the polysilicon gate in MOS transistors, and similarly between each of the tunnel oxide and the floating gate, bottom of the ONO dielectric and the floating gate, and top of the ONO dielectric and the control gate in a memory cell. In extreme cases, it may lead to gate oxide and/or tunnel oxide pinch-off or otherwise impact the integrity and reliability characteristics of the gate oxide in MOS transistors and the tunnel oxide and the ONO dielectric in memory cells.

In conventional processes, the room to achieve the necessary trade-off between the desirable and undesirable effects of the polysilicon doping is limited to only regulating the level of doping and uniformity of the doping profile across the polysilicon layers. Achieving the desired trade off thus often proves to be a difficult task from process and device optimization point of view.

Accordingly, there is a need for polysilicon layers structure and method of forming the same whereby an optimum polysilicon doping profile can be achieved, the depletion of the polysilicon and its associated adverse effects are prevented or minimized, the quality and uniformity of the polysilicon-oxide interface are improved, while the "smiling" effect in the dielectric layers interfacing polysilicon is minimized.

BRIEF SUMMARY OF THE INVENTION

In accordance with an embodiment of the present invention, a doped polysilicon layer interfaces a dielectric layer through an undoped polysilicon layer. In this manner, the drawbacks of the prior art structures wherein the doped polysilicon layer is in direct contact with the insulating layer are minimized or eliminated, while the advantages of a doped polysilicon layer is maintained.

In one embodiment, a semiconductor structure includes an undoped polysilicon layer, a doped polysilicon layer in contact with the undoped polysilicon layer, and an insulating layer in contact with the undoped polysilicon layer. The undoped polysilicon layer is sandwiched between the doped polysilicon layer and the insulating layer.

In another embodiment, a semiconductor non-volatile memory cell includes a first insulating layer over a substrate region. A first doped polysilicon layer overlies the first insulating layer, and a first undoped polysilicon layer overlies and is in contact with the first doped polysilicon layer. The doped and undoped polysilicon layers form a floating gate. A second insulating layer overlies and is in contact with the first undoped polysilicon layer. A second undoped polysilicon layer overlies and is in contact with the second insulating layer. A second doped polysilicon layer overlies and is in contact with the second undoped polysilicon layer. The second doped and undoped polysilicon layers form a control gate.

In another embodiment, the memory cell further includes a third undoped polysilicon layer over and in contact with the first insulating layer. The first doped polysilicon layer overlies and is in contact with the third undoped polysilicon layer. The third undoped polysilicon layer forms part of the floating gate.

In another embodiment, a thickness of each doped polysilicon layer is greater than a thickness of a corresponding undoped polysilicon layer by a factor in the range of two to four.

In accordance with another embodiment of the present invention, a semiconductor transistor includes an insulating layer over a substrate region. An undoped polysilicon layer overlies and is in contact with the insulating layer. A doped polysilicon layer overlies and is in contact with the undoped polysilicon layer. The doped and undoped polysilicon layers form a gate of the transistor.

In one embodiment, a thickness of the doped polysilicon layer is greater than a thickness of the undoped polysilicon layer by a factor in the range of two to four.

BRIEF DESCRIPTION OF THE DRAWINGS

FIG. 5 shows an exemplary doping profile through the floating gate in FIG. 3a.

DETAILED DESCRIPTION OF THE INVENTION

In accordance with an embodiment of the present invention, conventional semiconductor device structures wherein a doped polysilicon layer comes in contact with an insulating layer, such as silicon-dioxide, are modified so that the polysilicon layer comprises a doped and an undoped polysilicon layer with the undoped polysilicon layer interfacing with the insulating layer. In this manner, the drawbacks of the prior art structures wherein doped polysilicon layers are in direct contact with insulating layers are minimized or eliminated while the advantages of a doped polysilicon are maintained, as discussed in more detail below.

Figure 2:
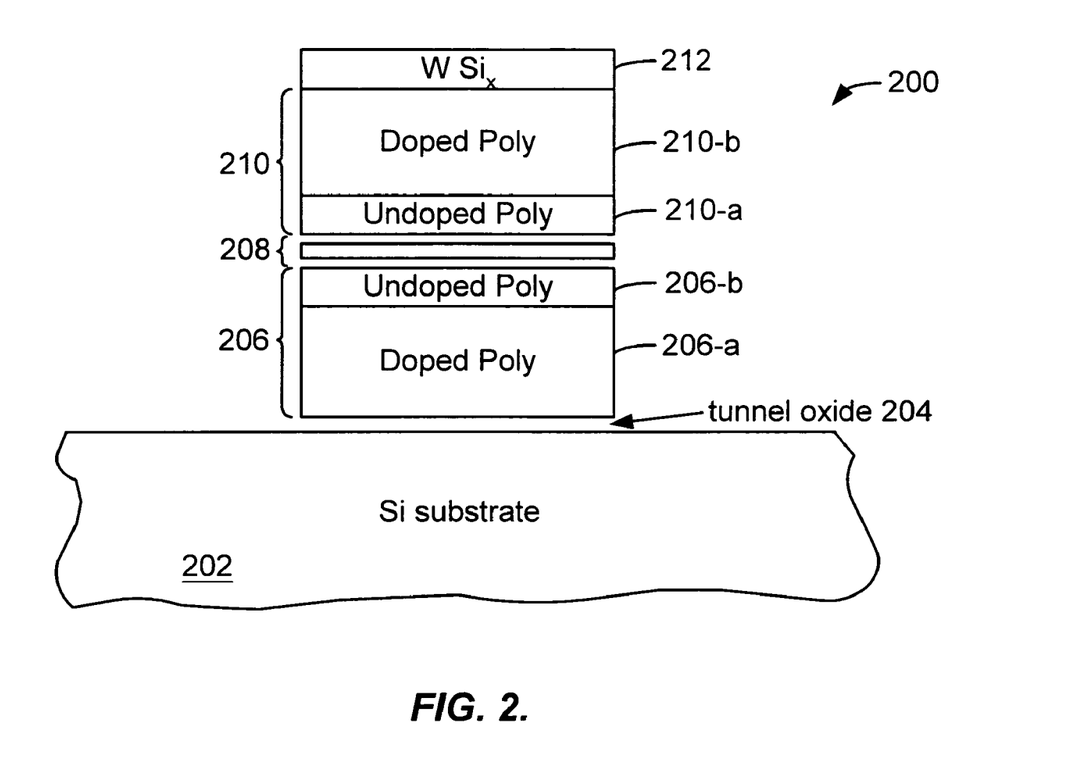
FIG. 2 shows a cross section view of a stacked-gate non-volatile memory cell at an intermediate processing stage, in accordance with one embodiment of the present invention.

FIG. 2 shows a cross section view of a stacked-gate non-volatile memory cell 200 at an intermediate processing stage, in accordance with an embodiment of the present invention. Memory cell 200 includes a tunnel oxide 204 over a silicon substrate 202. Floating gate 206 which comprises two polysilicon layers 206-a, 206-b overlies tunnel oxide 204. A composite oxide-nitride-oxide (ONO) dielectric layer 208 insulates floating gate 206 from an overlying control gate 210. Control gate 210 comprises two polysilicon layers 210-a, 210-b, and in some processes, is overlaid by a tungsten ($WSi_x$) layer 212. As shown, of the two polysilicon layers forming floating gate 206, the lower layer 206-a is doped while the upper layer 206-b is undoped, and of the two polysilicon layers forming control gate 210, the lower layer 210-a is undoped while the upper layer 210-b is doped. In this manner, ONO dielectric 208 is sandwiched between two undoped polysilicon layers 206-b and 210-a.

In one embodiment, the structure of FIG. 2 is formed as follows. Tunnel oxide 204 is formed over substrate 202 in accordance with conventional methods. In forming floating gate 206, two successive polysilicon deposition steps are carried out. First, an in-situ doped polysilicon deposition is performed to deposit doped polysilicon layer 206-a, followed by an undoped polysilicon deposition step to deposit undoped polysilicon layer 206-b. The polysilicon doping concentration (using for example phosphorus P31 as the dopant) is controlled by temperature and gas (e.g. PH3) flow rate and pressure, and the thickness of each polysilicon layer is controlled by deposition time and temperature.

After deposition of polysilicon layers 206-a, 206-b, inter-poly ONO dielectric 208 is formed in accordance with conventional methods. Next, in forming control gate 210, two successive polysilicon deposition steps are performed. First, an undoped polysilicon deposition step is carried out, followed by an in-situ doped polysilicon deposition step.

The tables below show the temperature, gas flow rate and pressure, doping concentration, and polysilicon thickness for each of the doped and undoped polysilicon layers in accordance with an exemplary embodiment of the present invention. This table reflects a thickness ratio of doped polysilicon to undoped polysilicon of in the range of 2:1 to 5:1, with a preferred ratio of 3:1. Note that the values in these tables are merely illustrative and not intended to be limiting. Varying these values to achieve the target parameters and the desired cell performance would be obvious to one skilled in this art in view of this disclosure.

| Doped Polysilicon | | | | | |
|---|---|---|---|---|---|
| Doping con. target; $cm^{-3}$ | Thickness target; Å | Temperature; °C. | SiH4 flow rate; sccm | PH3 flow rate; sccm | Pressure; mTorr |
| $2 \times 10^{19}$– $1 \times 10^{20}$ | 450–750 | 580–620 | 1200–1400 | 50–100 | 350–450 |

| Undoped Polysilicon | | | | |
|---|---|---|---|---|
| Thickness target; Å | Temperature; °C. | SiH4 flow rate; sccm | PH3 flow rate; sccm | Pressure; mTorr |
| 150–250 | 580–620 | 1200–1400 | 0 | 350–450 |

After deposition of the polysilicon layers in forming control gate 210, a tungsten (WSi$_x$) layer 212 is optionally deposited in accordance with conventional methods. In some processes, an ARC oxynitride layer (not shown) is deposited over the tungsten layer to complete gate layer formation. This is followed by gate mask and gate etch to form the control gate of the memory cell and the gate of peripheral transistors, and then self-aligned mask and self-aligned etch (SAE) is carried out to form the gate stack as it appears in FIG. 2. All subsequent steps, including source/drain formation and side-wall spacer formation, are carried out in accordance with conventional methods.

During thermal oxidation and anneal cycles, such as ONO steam anneal (after ONO deposition), polysilicon re-oxidation after gate stack formation, and source/drain oxidation cycle(s), the top and bottom oxide layers in ONO dielectric 208 at the periphery of the gate stack (side walls) grow at a lower rate due to the lower oxidation rate of undoped polysilicon layers which interface the two oxide layers. Thus, ONO dielectric "smiling" effect is substantially reduced. The tunnel oxide "smiling" effect can similarly be reduced by including another undoped polysilicon layer as the bottom polysilicon layer of the floating gate. This is shown in the FIG. 3a embodiment. An undoped polysilicon layer 306-c forms the bottom layer of floating gate 306, interfacing tunnel oxide 304.

Other than the reduction in "smiling" effect, the smaller grain size of undoped polysilicon yields a polysilicon-oxide interface which is more uniform leading to improved tunnel oxide and ONO dielectric quality and integrity. Further, by selecting proper doping concentration in the doped polysilicon layers and proper thickness ratio between adjacent doped and undoped polysilicon layers, by the end of the thermal cycles, a uniform and high enough doping concentration can be achieved throughout the whole floating gate and control gate so as to prevent polysilicon depletion effects.

Figure 5:
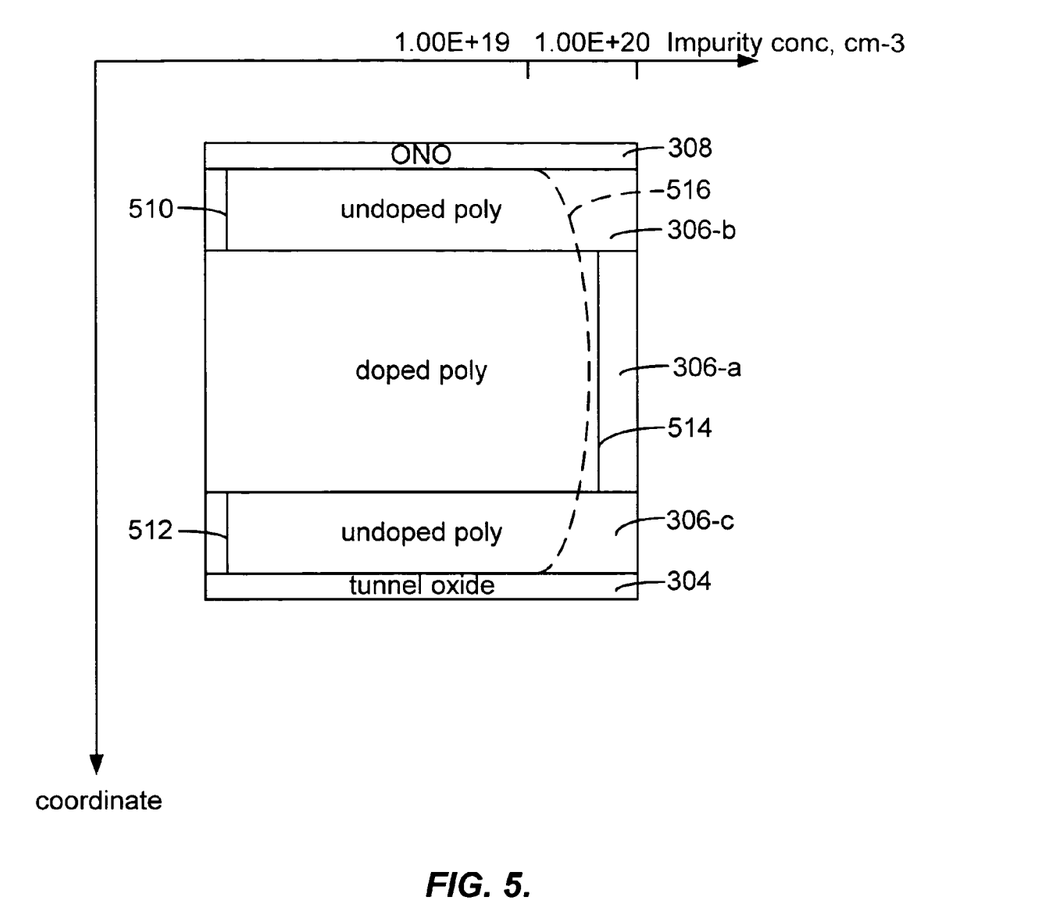

By the end of the oxidation/anneal thermocycle, depending on the thermal budget, the impurity (e.g., phosphorus) profile in the undoped polysilicon layers may be of diffusion character. FIG. 5 shows an exemplary impurity profile through floating gate 306 in FIG. 3a. The horizontal axis represents the impurity concentration, and the vertical axis represents the dimension along the stack, from top to bottom, of ONO dielectric 308, floating gate 306, and tunnel oxide 304. Solid lines 510, 512, 514 indicate the impurity concentration in the respective undoped polysilicon layer 306-b, undoped polysilicon layer 306-c, and doped polysilicon layer 306-a before carrying out the thermal cycles. The dashed, curved line 516 shows the impurity profile through the three polysilicon layers after the thermal cycles. Note that even though polysilicon layers 306-b, 306-c are undoped, they acquire some impurities during their deposition process. Solid lines 510 and 512 represent this impurity concentration before the thermal cycles are carried out.

After the thermal cycles, as shown by dashed line 516, the impurity concentration is highest in the doped polysilicon layer 306-a and gradually reduces at the boundaries between the doped and undoped polysilicon layer and through the undoped polysilicon layers 306-b, 306-c, and reaches its lowest concentration level at the interface between the undoped polysilicon layers 306-b, 306-c and the corresponding tunnel oxide 304 and ONO dielectric layer 308. The thickness of the polysilicon layers and the thermocycles need to be optimized such that the final polysilicon doping concentration and its gradient at the polysilicon-dielectric interface is high enough to prevent or minimize polysilicon depletion effects.

Note that despite the high final doping concentration at the polysilicon-dielectric interface, the benefits of using undoped polysilicon layers are maintained. The diffusion of dopants from the doped polysilicon layer to the undoped polysilicon layers occurs slowly during the thermocycles. Thus, because the doping concentration at the polysilicon-dielectric interface is relatively low during a significant part of the oxidation processes, a reduced smiling effect is achieved. At the same time, the undoped polysilicon layers retain smaller size and more uniform grain structure, resulting in better uniformity and quality of polysilicon-dielectric interface.

Figure 3A:
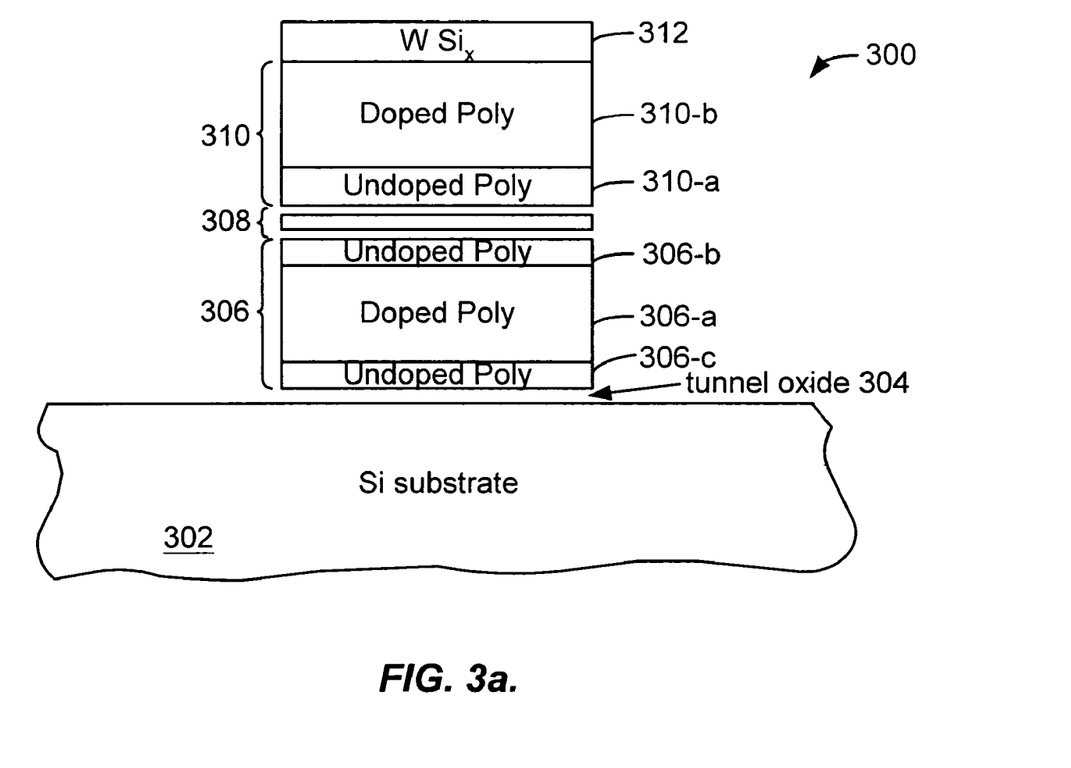
FIG. 3a shows a cross section view of a variation of the FIG. 2 memory cell structure in accordance with another embodiment of the present invention.
Figure 3B:
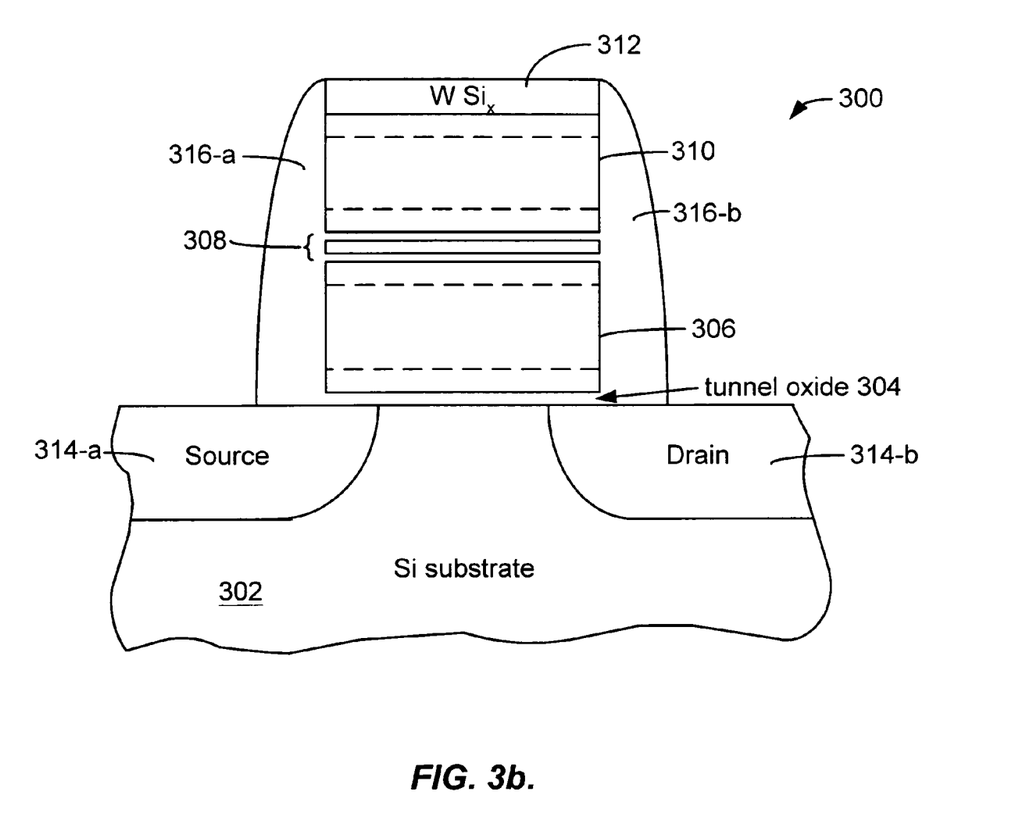
FIG. 3b shows a cross section view of the cell structure of FIG. 3a after source/drain formation, side-wall spacers formation, and all thermal oxidation and anneal cycles.

FIG. 3b shows the cell structure of FIG. 3a after source/drain 314-a, 314-b and side-wall spacers 316-a, 316-b formation and all thermal oxidation and anneal cycles. As shown, by using multi-layers of doped/undoped polysilicon in both the floating gate and the control gate, the "smiling" effect (shown by circles 118 and 120 in FIG. 1b) is reduced.

Accordingly, by providing a combination of doped and undoped polysilicon layers in each of the floating gate and the control gate, a more flexible process is obtained whereby much of the adverse effects associated with the trade-offs in the polysilicon doping concentration present in conventional processes is eliminated. By providing undoped polysilicon at the dielectric interfaces, an ONO dielectric and a tunnel oxide layer having uniform thicknesses and improved dielectric quality and integrity are achieved while a high enough doping concentration in most of the floating gate and the control gate is maintained. Also, after all the thermal cycles, a relatively homogeneous polysilicon doping across the whole floating gate and control gate is obtained. Further, the tunnel oxide and the ONO dielectric are more uniform both in terms of their geometrical thickness and in terms of their dielectric quality and integrity. High uniformity of tunnel oxide and ONO result in better gate control over the channel, higher coupling ratio between the control gate and the floating gate, enhanced program, erase, and read efficiency, tighter erase distribution, and allow use of lower operating voltages. Further the improved quality of the ONO dielectric and tunnel oxide results in improved charge retention characteristics and overall reliability of the memory cell. Thus, a memory cell with a much improved electrical and reliability characteristics is achieved.

Figure 4A:
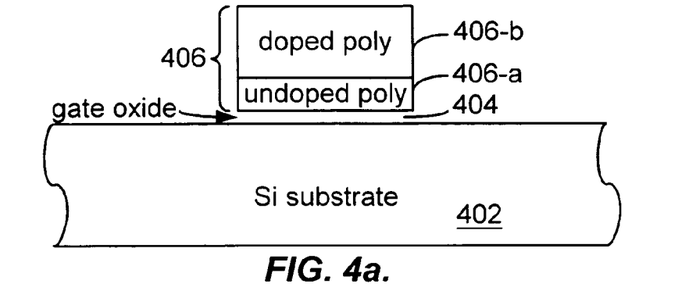
FIGS. 4a, 4b, 4c show cross section views of an MOS transistor at two different processing stages in accordance with an embodiment of the present invention.
Figure 4B:
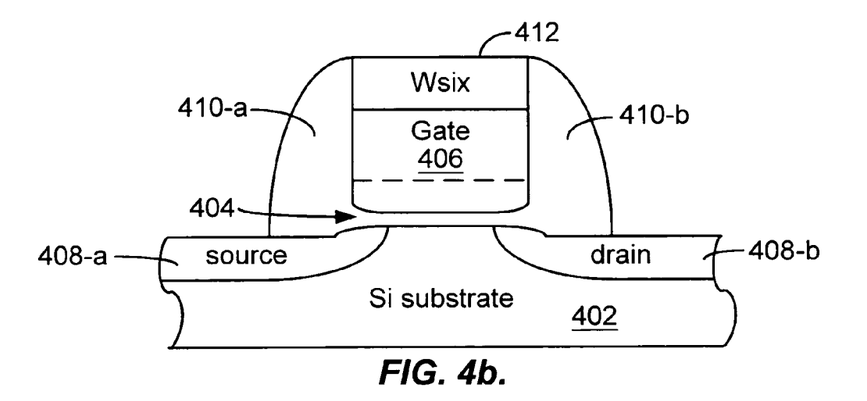
Figure 4C:
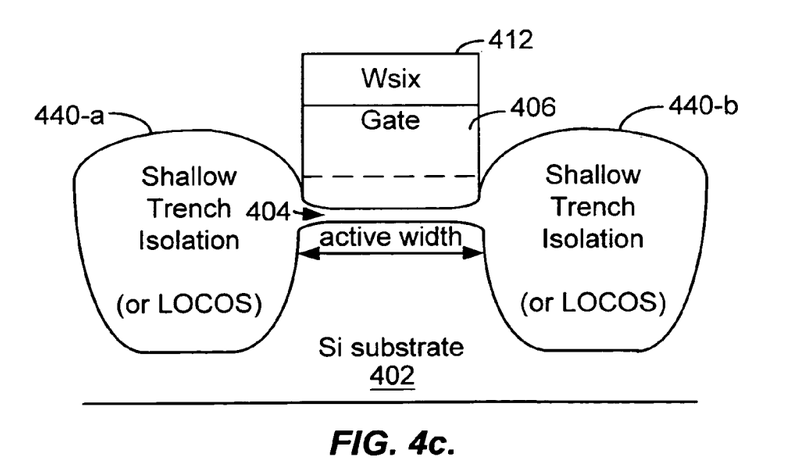

FIGS. 4a, 4b, 4c show cross section views of a MOS transistor at two different processing stages in accordance with another embodiment of the present invention. In FIG.

4a, gate oxide 404 is formed over substrate 402 in accordance with conventional methods. Next, two successive polysilicon deposition steps are carried-out in forming transistor gate 406. First, an undoped polysilicon layer is deposited in forming undoped polysilicon layer 406-a, followed by an in-situ doped polysilicon deposition step in forming doped polysilicon layer 406-b. Similar to the above memory cell embodiments, the polysilicon doping concentration (using for example phosphorus P31 as the dopant) is controlled by temperature and gas (e.g. PH3) flow rate and pressure, and the thickness of each polysilicon layer is controlled by deposition time and temperature.

All subsequent processing steps are carried out in accordance with conventional methods. FIGS. 4b and 4c show two different cross sections of the transistor structure after source/drain 408-a, 408-b formation, side-wall spacers 410-a, 410-b formation, and all thermal oxidation and anneal cycles. FIG. 4b shows the cross section of the transistor along the gate length of the transistor, and FIG. 4c shows the cross section of the transistor along the gate width of the transistor through the channel region (the transistor width is the size of active area between two isolation areas).

As shown, by using the doped/undoped polysilicon layers, the "smiling" effect is reduced not only at the outer edges of gate oxide 404 near the drain and source regions (FIG. 4b), but also at the periphery of the active and isolation areas 440-a, 440-b (FIG. 4c). Although the increase in the thickness of the gate oxide at the transitional area between the active and isolation regions is mainly determined by the so called "bird's beak" effect of the isolation regions (which is stronger for LOCOS isolation and smaller for shallow trench isolation), high polysilicon doping of the gate in conventional processes, and the resulting "smiling" effect, results in an even thicker gate oxide at the transitional areas. Controlling the polysilicon doping at the gate oxide interface minimizes the contribution to the thicker gate oxide by the "smiling" effect, and thus improves transistor performance (gate control, drive current). This is specially advantageous for short active width devices. More importantly, the smaller grain size and uniformity of grain structure in the initially undoped polysilicon layer helps improve uniformity and quality of polysilicon-oxide interface and gate oxide thickness, leading to improved reliability.

The MOS transistor polysilicon gate can be formed simultaneously (i.e., using the same mask step) with the control gate of the memory cell. That is, the same two successive deposition steps in forming an undoped polysilicon layer followed by a doped polysilicon layer may be carried out to simultaneously form the control gate of the memory cells and the gate of periphery transistors. In another embodiment, the MOS transistor polysilicon gate can be formed simultaneously with the floating gate rather than with the control gate. In the memory cell embodiment wherein the floating gate comprises three polysilicon layers (FIG. 3a), the top undoped polysilicon layer is not useful in the periphery transistor, but may be present if a sufficiently uniform final doping could be obtained. In yet another embodiment, the gate of the peripheral transistors is formed simultaneously with the combined floating gate and control gate polysilicon layers. This embodiment, as in many flash EPROM processes, requires that the interpoly ONO dielectric be removed from the periphery.

The present invention is not limited in application to MOS transistors and stacked gate non-volatile memories. Any structure wherein doped polysilicon comes in contact with an insulating layer can benefit from the doped/undoped multi-layer polysilicon approach described herein. Examples of other structures include N-channel or P-channel non-volatile memory cells such as ROM, EPROM, EEPROM, and flash EEPROM cells, volatile memory cells such as DRAM and SRAM cells, NMOS and PMOS transistors, and depletion and enhancement transistors. Further, the present invention is not limited to any specific parameters or values indicated herein. For example, the values indicated in the tables above correspond to one particular process and set of targets, and may be varied to accommodate other processes and cell technologies.

While the above is a complete description of preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents.

What is claimed is:

1. A method of forming a semiconductor non-volatile memory cell, comprising:
    forming a first insulating layer over a silicon region;
    forming a first doped polysilicon layer over the first insulating layer;
    forming a first undoped polysilicon layer over and in contact with the first doped polysilicon layer, the first doped and first undoped polysilicon layers forming a floating gate;
    forming a second insulating layer over and in contact with the first undoped polysilicon layer;
    forming a second undoped polysilicon layer over and in contact with the second insulating layer; and
    forming a second doped polysilicon layer over and in contact with the second undoped polysilicon layer, the second doped and undoped polysilicon layers forming a control gate,
    wherein dopants from the first doped polysilicon layer migrate into the first undoped polysilicon layer thereby doping the first undoped polysilicon layer, and dopants from the second doped polysilicon layer migrate into the second undoped polysilicon layer thereby doping the second undoped polysilicon layer.

2. The method of claim 1 further comprising: before said first doped polysilicon forming act, forming a third undoped polysilicon layer over and in contact with the first insulating layer wherein the first doped polysilicon layer overlies and is in contact with the third undoped polysilicon layer, the third undoped polysilicon layer forming part of the floating gate,
    wherein dopants from the first doped polysilicon layer migrate into the third undoped polysilicon layer thereby doping the third undoped polysilicon layer.

3. The method of claim 1 wherein the first insulating layer is a tunnel oxide layer and the second insulating layer comprises a composite oxide-nitride-oxide layer.

4. The method of claim 1 wherein:
    a thickness of the first doped polysilicon layer is greater than a thickness of the first undoped polysilicon layer by a factor in the range of two to four, and
    a thickness of the second doped polysilicon layer is greater than a thickness of the second undoped polysilicon layer by a factor in the range of two to four.

5. The method of claim 1 further comprising:
    forming insulating spacers along sidewalls of the stack made up of the first insulating layer, the floating gate, the second insulating layer, and the control gate; and
    forming source and drain regions in the silicon region.

6. The method of claim 1 wherein each of said first and second doped polysilicon layers forming acts comprises depositing an in-situ doped polysilicon layer.

7. The method of claim 1 wherein the memory cell is any one of a stacked-gate non-volatile cell and a split gate non-volatile cell.

8. The method of claim 1 wherein each of the first and second doped polysilicon layers respectively has a doping concentration and a thickness greater than a thickness of the first and second undoped polysilicon layers so as to prevent polysilicon depletion in each of the floating gate and the control gate.

9. The method of claim 1 wherein the non-volatile memory cell is any one of ROM, flash EPROM, and EEPROM.

10. The method of claim 1 wherein the first insulating layer is a tunnel oxide layer and the second insulting layer comprises a composite oxide-nitride-oxide-nitride layer.

11. The method of claim 1 further comprising:

forming a conductive layer comprising tungsten over and in contact with the second doped polysilicon layer.

* * * * *